United States Patent
Harris et al.

(10) Patent No.: US 10,545,211 B2
(45) Date of Patent: Jan. 28, 2020

(54) METHOD OF CORRECTING GRADIENT NONUNIFORMITY IN GRADIENT MOTION SENSITIVE IMAGING APPLICATIONS

(71) Applicants: Chad Tyler Harris, Toronto (CA); Andrew Thomas Curtis, Toronto (CA); Philip Beatty, Toronto (CA); Jeff Alan Stainsby, Toronto (CA)

(72) Inventors: Chad Tyler Harris, Toronto (CA); Andrew Thomas Curtis, Toronto (CA); Philip Beatty, Toronto (CA); Jeff Alan Stainsby, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 297 days.

(21) Appl. No.: 15/635,898

(22) Filed: Jun. 28, 2017

(65) Prior Publication Data
US 2019/0004137 A1 Jan. 3, 2019

(51) Int. Cl.
*G01R 33/565* (2006.01)

(52) U.S. Cl.
CPC .............. *G01R 33/56509* (2013.01)

(58) Field of Classification Search
CPC .............. G01R 33/56509; G01R 33/56572
USPC ........................................... 324/309
See application file for complete search history.

(56) References Cited

U.S. PATENT DOCUMENTS

| 7,902,825 B2* | 3/2011 | Bammer ......... G01R 33/56509 324/307 |
| 9,606,209 B2* | 3/2017 | Ernst ............... G01R 33/56509 |
| 2016/0313434 A1 | 10/2016 | Panther et al. |

FOREIGN PATENT DOCUMENTS

WO   2002041024 A1   5/2002

OTHER PUBLICATIONS

Search Report issued by the UK Intellectual Property Office in relation to corresponding GB Application No. GB1810426.5 dated Dec. 21, 2018, 3 pgs.

* cited by examiner

*Primary Examiner* — Reena Aurora
(74) *Attorney, Agent, or Firm* — Ridout & Maybee LLP

(57) ABSTRACT

The present disclosure provides a method and system for correcting errors caused by non-linearities in a gradient field profile of a gradient coil in a magnetic resonance imaging (MRI) system. The method includes obtaining a non-linearity tensor at each voxel within the imaging space using a computer model of the gradient coil; correcting motion sensitive encoding using the non-linearity tensor; and generating a corrected image using the corrected motion sensitive encoding.

20 Claims, 4 Drawing Sheets

METHOD OF CORRECTING GRADIENT NONUNIFORMITY IN GRADIENT MOTION SENSITIVE IMAGING APPLICATIONS

FIELD

The present disclosure relates generally to motion sensitive magnetic resonance (MR) imaging and more specifically, to correcting errors in MR imaging due to gradient coil non-linearities.

BACKGROUND

The signal intensity generated during magnetic resonance imaging can be encoded using various mechanisms to allow conversion to spatial images. For example, gradient coils (high power electromagnets) may be used to encode spatial information. The spatial encoding is achieved by causing the gradient coils to produce a linearly varying magnetic field with position in an imaging volume within which the image to be scanned is placed. In real world implementations, the field profiles produced by the gradient coils deviate from strictly linear. The amount of deviation depends on spatial position within the image.

These gradient coil non-linearities can cause errors in various types of MR imaging, including diffusion weighted, phase-contrast, or intravoxel incoherent motion (IVIM) imaging. The non-uniformity of the gradient fields often leads to spatially dependent errors in the direction and magnitude of the motion sensitive encoding. Such gradient coil non-linearities may be particularly pronounced when the gradient coils are asymmetric, for example, when imaging the brain using diffusion weighted imaging.

In order to correct for these errors, the non-linearity tensor for the gradient coil set are often calculated on a pixel by pixel basis. To calculate the non-linearity tensor, the gradient of the magnetic field produced by each gradient coil must be known. The magnetic field of the gradient coils have conventionally been found experimentally or by approximation using a spherical harmonic expansion. The gradient of these fields were then calculated numerically or analytically.

However, finding the magnetic field of the gradient coils experimentally may be problematic because 1) voxel discretization of an image leads to a discrete distortion map rather than a desirable continuous one, and 2) the distortion caused by B0 inhomogeneity from the primary magnet, which is sequence specific, is included in the distortion map.

Numerically calculating the gradient of the field may also be not ideal since one must have a sampling of the field at a higher resolution to determine what is required for the gradient. One must also sample at least two points and do a difference per direction in the calculations. This tends to lead to increased processing time.

In particular, spherical harmonic representation of the fields and analytic calculation of the gradient of the fields can pose problems for asymmetric gradient coils, which may be used for stroke imaging. The number of harmonic terms needed to accurately represent the field grows substantially for asymmetric gradient coils. Therefore, it is often difficult to express or represent such coils using spherical harmonics.

SUMMARY

According to an example aspect, the present disclosure provides a method of correcting errors caused by non-linearities in a gradient field profile of a gradient coil in a magnetic resonance imaging (MRI) system. The method includes obtaining a non-linearity tensor at each voxel within the imaging space using a computer model of the gradient coil, correcting motion sensitive encoding using the non-linearity tensor, and generating a corrected image using the corrected motion sensitive encoding.

According to another example aspect, the present disclosure provides a system for correcting errors caused by non-linearities in a gradient field profile of a gradient coil in a magnetic resonance imaging (MRI) system. The system includes a receiver for receiving a signal from an imaging volume, and a processor coupled to the receiver. The processor is configured to obtain a non-linearity tensor at each voxel within the imaging space using a computer model of the gradient coils of the system, correct motion sensitive encoding using the non-linearity tensor, and generate a corrected image from the signal using the corrected motion sensitive encoding.

BRIEF DESCRIPTION OF THE DRAWINGS

Example embodiments of the present disclosure are provided in the following description. Such description makes reference to the annexed drawings wherein.

DESCRIPTION OF EXAMPLE EMBODIMENTS

Traditional magnetic resonance imaging (MRI) systems represent an imaging modality which is primarily used to construct pictures of magnetic resonance (MR) signals from protons such as hydrogen atoms in an object. In medical MRI, typical signals of interest are MR signals from water and fat, the major hydrogen containing components of tissues.

Figure 1:
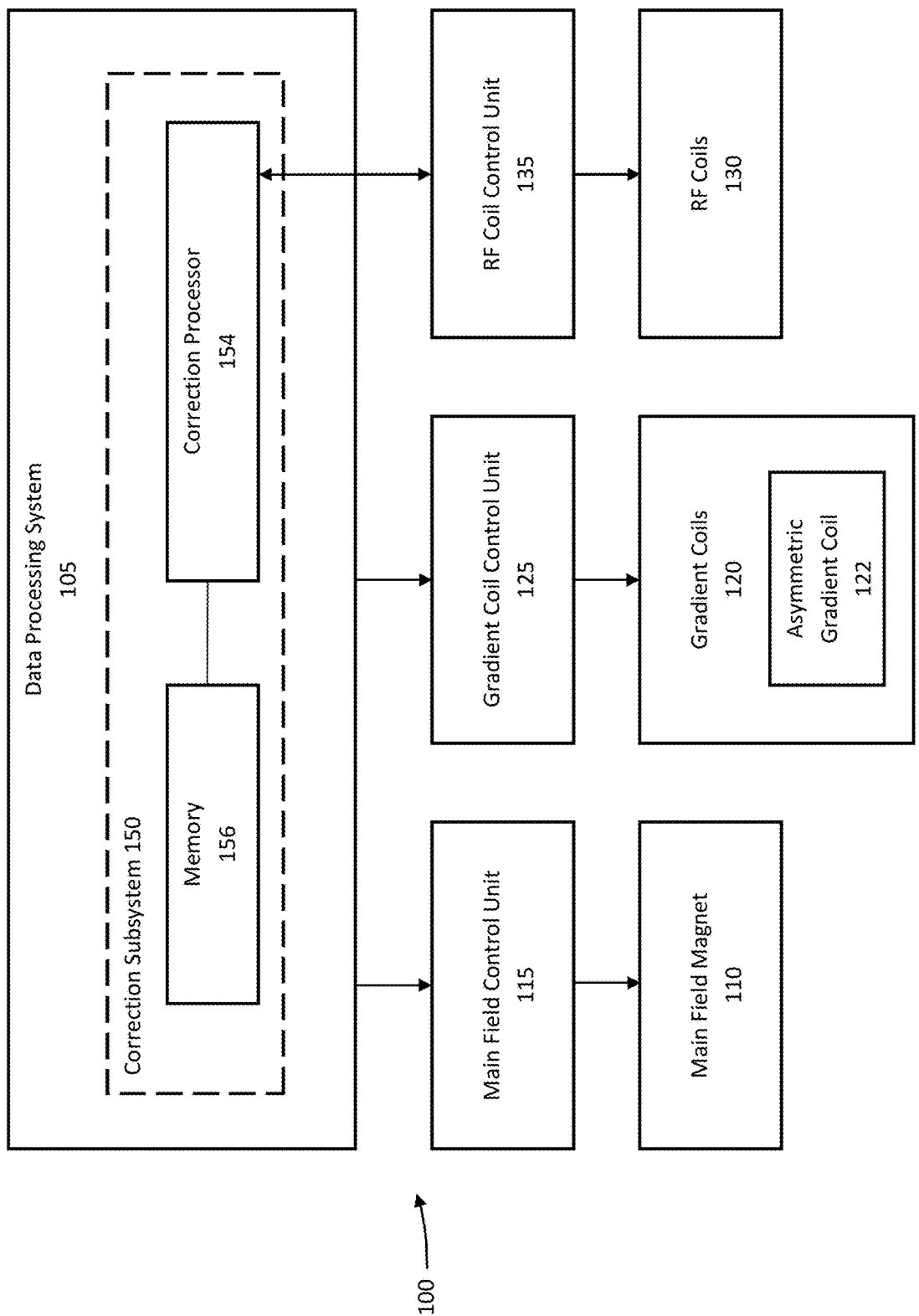
FIG. 1 is a block diagram of a magnetic resonance imaging (MRI) system, in accordance with an example embodiment.

Referring to FIG. 1, a block diagram of a magnetic resonance imaging (MRI) system, in accordance with an example implementation, is shown at 100. The example implementation of MRI system indicated at 100 is for illustrative purposes only, and variations including additional, fewer and/or varied components are possible.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 may further comprise one or more interfaces adapted for communication and data exchange with the hardware components of MRI system 100 used for performing a scan.

Continuing with FIG. 1, example MRI system 100 also includes a main field magnet 110. The main field magnet 110 may be implemented as a permanent, superconducting or a resistive magnet, for example. Other magnet types, including hybrid magnets suitable for use in MRI system 100 are contemplated. Main field magnet 110 is operable to produce a substantially uniform main magnetic field having strength B0 and a direction along an axis. The main magnetic field is used to create an imaging volume within which desired atomic nuclei, such as the protons in hydrogen within water and fat, of an object are magnetically aligned in preparation for a scan. In some implementations, as in this example implementation, a main field control unit 115 in communication with data processing system 105 may be used for controlling the operation of main field magnet 110.

MRI system 100 further includes gradient coils 120 used for encoding spatial information in the main magnetic field along, for example, three perpendicular gradient axes. The size and configuration of the gradient coils 120 may be such that they produce a controlled and uniform linear gradient. For example, three paired orthogonal current-carrying primary coils located within the main field magnet 110 may be designed to produce desired linear-gradient magnetic fields. As shown in the present embodiment, gradient coils 120 include at least one asymmetric gradient coil 122.

In some implementations, gradient coils 120 may be shielded and include an outer layer of shield coils which can produce a counter magnetic field to counter the gradient magnetic field produced by the primary gradient coils forming a primary-shield coils pair. In such a coil pair the "primary" coils can be responsible for creating the gradient field and the "shield" coils can be responsible for reducing the stray field of the primary coil outside a certain volume such as an imaging volume. The primary and shield coils of the gradient coils 120 may be connected in series.

It is also possible to have more than two layers of coils for any given gradient axis that together form a shielded gradient coil. Shielded gradient coils 120 may reduce eddy currents and other interference which can cause artefacts in the scanned images. Since eddy currents mainly flow in conducting components of the MRI system 100 that are caused by magnetic fields outside of the imaging volume (fringe fields), reducing the fringe fields produced by gradient coils 120 may reduce interference. Accordingly, the shapes and sizes, conductor wire patterns and sizes, and current amplitudes and patterns of the primary-shield coils pair can be selected so that the net magnetic field outside the gradient coils 120 is as close to zero as possible. For cylindrical magnets, for example, the two coils may be arranged in the form of concentric cylinders whereas for vertical field magnets, the two coils may be arranged in coaxial disks.

The conductive components of the gradient coils 120, whether shielded or unshielded and including the primary and shield coils, may include an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils may be insulated by physical separation and/or a non-conductive barrier.

The magnetic fields produced by the gradient coils 120, in combination and/or sequentially, can be superimposed on the main magnetic field such that selective spatial excitation of objects within the imaging volume occurs. In addition to allowing spatial excitation, the gradient coils 120 may attach spatially specific frequency and phase information to the atomic nuclei placed within the imaging volume, allowing the resultant MR signal to be reconstructed into a useful image. A gradient coil control unit 125 in communication with data processing system 105 is used to control the operation of gradient coils 120.

In some implementations of MRI system 100, there may be additional electromagnet coils present (not shown), such as shim coils (traditionally, but not limited to, producing magnetic field profiles of 2nd order or higher spherical harmonics) or a uniform field offset coil or any other corrective electromagnet. To perform active shimming (correcting the field distortions that are introduced when different objects are placed within or around the system), the corrective electromagnets, such as the shim coils, carry a current that is used to provide magnetic fields that act to make the main magnetic field more uniform. For example, the fields produced by these coils may aid in the correction of inhomogeneities in the main magnetic field due to imperfections in the main magnet 110, the presence of external ferromagnetic objects, or susceptibility differences of materials within the imaging region, or due to any other static or time-varying phenomena.

The MRI system 100 further includes radio frequency (RF) coils 130. The RF coils 130 are used to establish an RF magnetic field with strength B1 to excite the atomic nuclei or "spins". The RF coils 130 can also detect signals emitted from the "relaxing" spins within the object being imaged. Accordingly, the RF coils 130 may be in the form of separate transmit and receive coils or a combined transmit and receive coil with a switching mechanism for switching between transmit and receive modes.

The RF coils 130 may be implemented as surface coils, which are typically receive only coils and/or volume coils which can be receive and transmit coils. RF coils 130 can be integrated in the main field magnet 110 bore. Alternatively, RF coils 130 may be implemented in closer proximity to the object to be scanned, such as a head, and can take a shape that approximates the shape of the object, such as a close-fitting helmet. An RF coil control unit 135 in communication with data processing system 105 may be used to control the operation of the RF coils 130 in either a transmit aspect or a receive aspect.

As shown in FIG. 1, data processing system 105 further includes a correction subsystem 150 for correcting errors caused by non-linearities in a gradient field profile of gradient coils 120 in MRI system 100. Correction subsystem 150 includes correction processor 154, which is coupled to receiving RF Coil 130 and a memory 156. Correction processor 154 is configured to obtain a non-linearity tensor at each voxel within the imaging volume by retrieving the non-linearity tensor from memory 156 and/or, by using a computer model of gradient coils 120 of MRI system 100, finding the non-linearity tensor, correcting motion sensitive encoding using the non-linearity tensor, and then generating a corrected image from the signals from RF Coils 130 using the corrected motion sensitive encoding. Correction processor 154 may be configured to perform the above applications by carrying out instructions stored in memory. Correction subsystem 150 may not necessarily be a separate component of data processing system 105, in that the general processor of data processing system 105 may perform the above-noted steps in conjunction with the general memory of data processing system 105. Use of correction subsystem 150 will be discussed in further detail below.

To obtain images from the MRI system 100, one or more sets of RF pulses and gradient waveforms (collectively called "pulse sequences") are selected at the data processing system 105. The data processing system 105 communicates the selected pulse sequence information to the RF control unit 135 and the gradient control unit 125, which collectively generate the associated waveforms and timings for providing a sequence of pulses to perform a scan.

Typically, the gradient field profiles produced by gradient coils 120 include deviations from the profile of a linear field.

Figure 2:
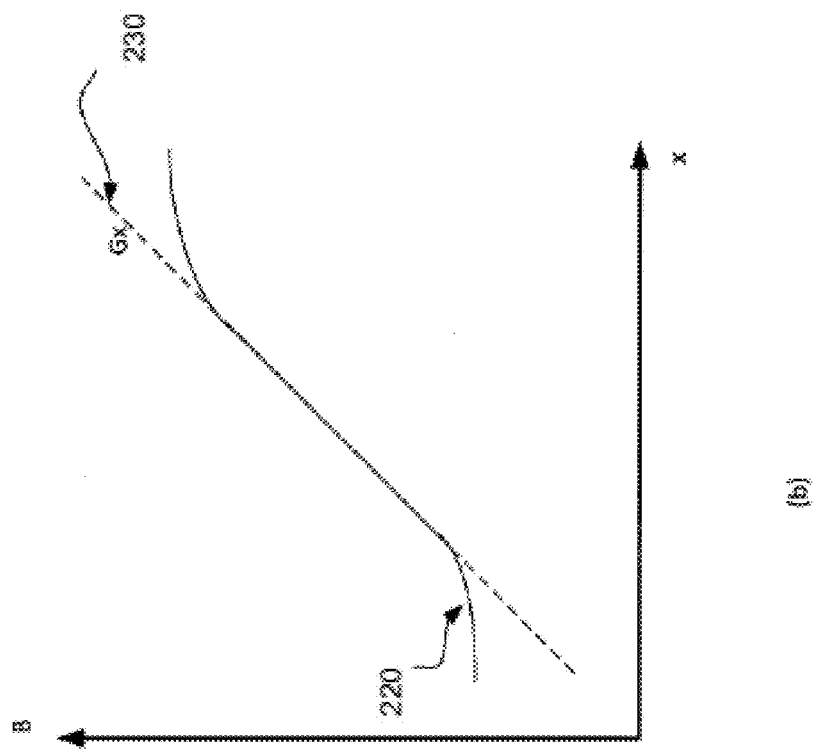
FIG. 2 shows example magnetic field profiles generated by gradient coils along one spatial dimension.
Figure 2:
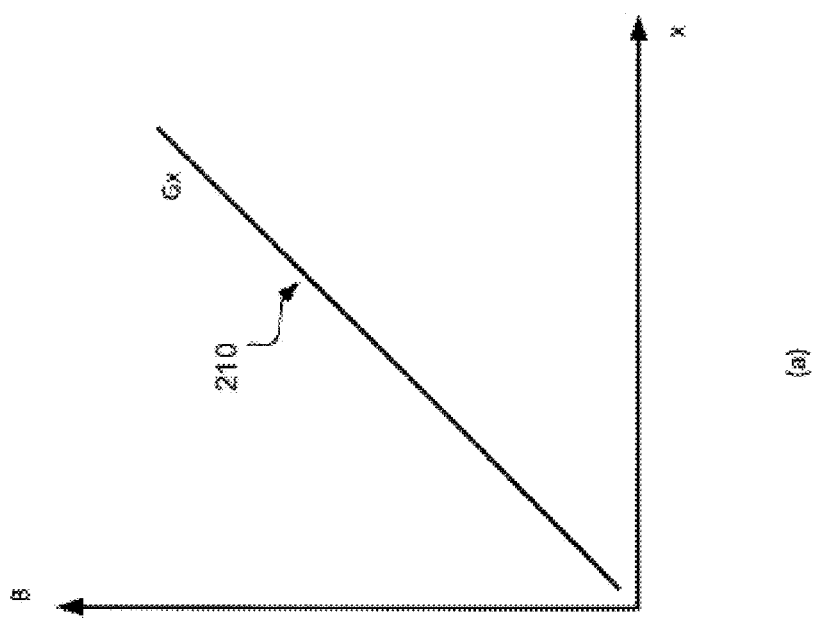

As an illustrative example, as shown in FIG. 2(a), when a gradient field is applied along the X-axis by the gradient coils 120, the ideal strength of the main magnetic field, indicated by 210, profiled along the X-axis in space is ideally linear and has a slope of Gx, which is the desired gradient generated by gradient coils 120 along the X-axis. As indicated in FIG. 2(b), at 220, however, the actual profile of the magnetic field strength deviates from the desired gradient Gx. In FIG. 2(b), the ideal gradient Gx is indicated with dotted lines at 230, for reference. Deviations of the gradient field profiles from a linear profile typically lead to acquired images that are either spatially warped and/or result in serious artefacts.

Figure 3:
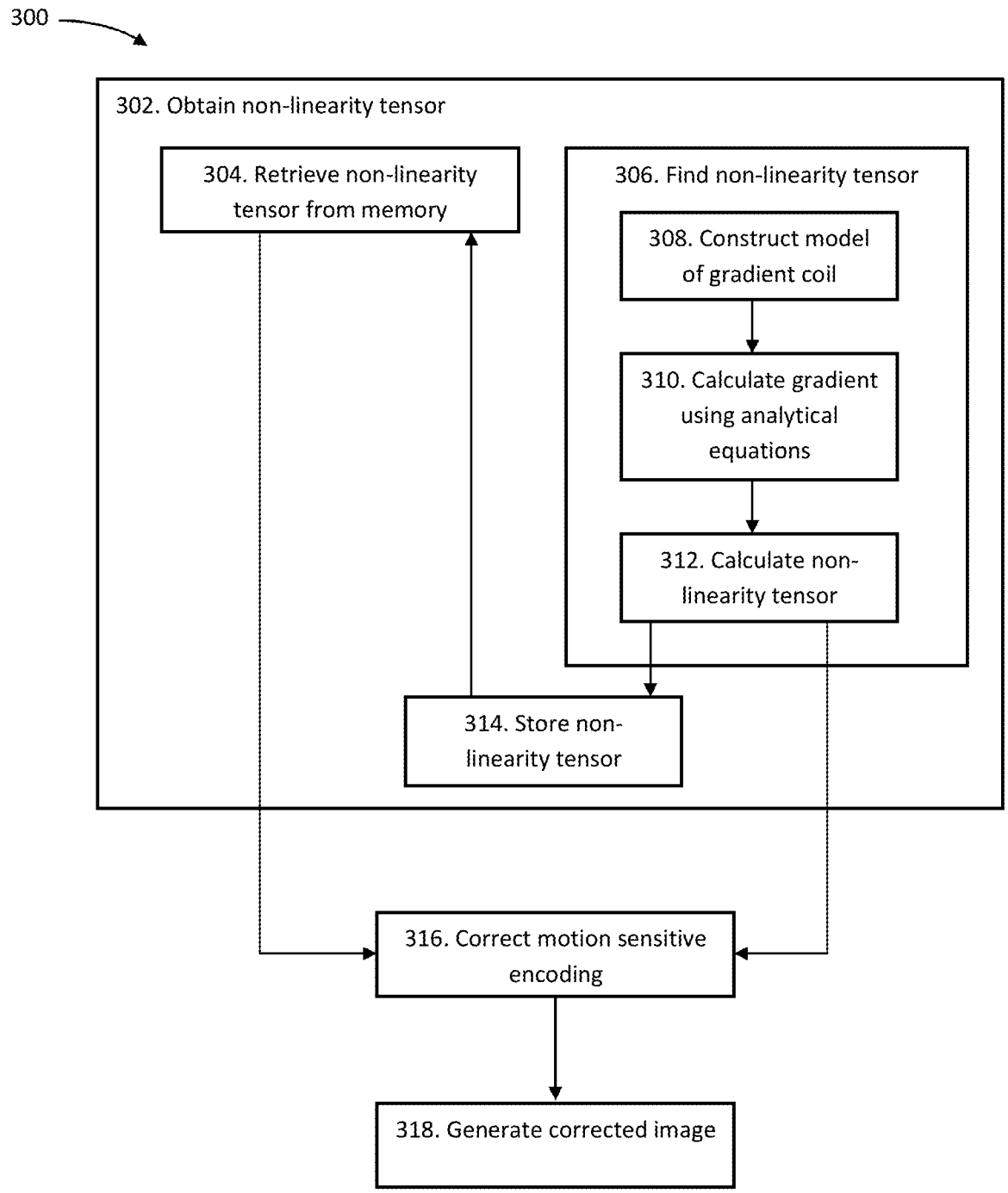
FIG. 3 is a flow chart showing a method for correcting errors using the system of FIG. 1 in accordance with an embodiment.

According to an aspect of the present disclosure, parameters of the waveform may be adjusted to correct for errors caused by the non-linearities in the gradient field profiles. Referring now to FIG. 3, a method of correcting non-linearity errors is indicated generally at 300. In some examples, method 300 may be at least in part operated using the MRI system 100 as shown in FIG. 1. Additionally, the following discussion of method 300 leads to further understanding of system 100. However, it is to be understood that system 100, and method 300 can be varied, and need not work exactly as discussed herein in conjunction with each other, and that such variations are within scope of the appended claims.

To correct for errors caused by gradient non-linearities, a non-linearity tensor at each voxel within the imaging volume is obtained at 302 using a computer model of gradient coils 120. The non-linearity tensor may be obtained by retrieving a pre-calculated non-linearity tensor from memory 156 at 304, or by finding the non-linearity tensor beforehand, i.e. before imaging, or during imaging, i.e. in real-time, at 306.

Figure 4:
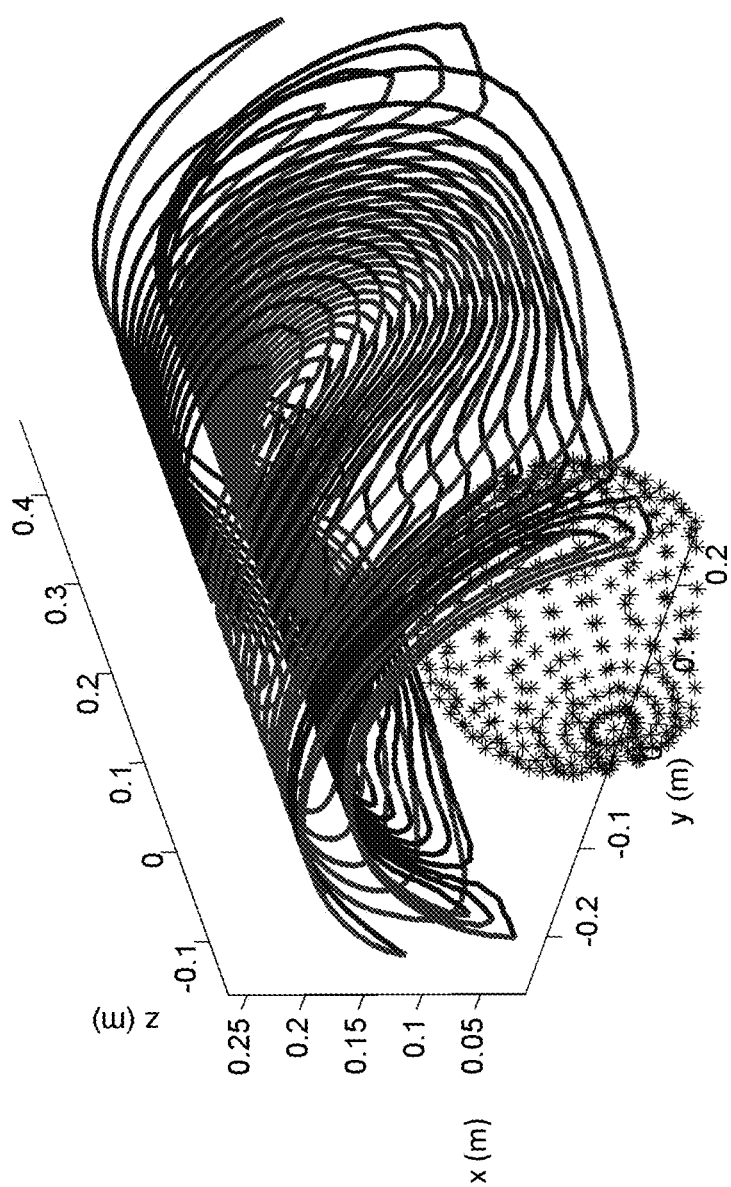
FIG. 4 shows an example computer model of a wire pattern for a transverse gradient coil.

To find the non-linearity tensor, a computer model of the gradient coils 120 is created at 308. The model represents the elements present in the gradient coils 120, such as the wire pattern of the coils present in the MRI system 100, including, for example, wire connections. For example, the model can include conductive elements of primary coils and, in variations, shield coils. The model is typically constructed to be as accurate a representation of the gradient coils 120 as possible based on computer modelling techniques. One example model is based on element arrays, that is, the electromagnet is modelled as a set of small current elements, which, when joined together, form the wire pattern of the electromagnet. The element array model may include connecting pathways of the gradient coils 120 as well as any other current carrying wires that are present in the gradient coils 120. Based on the element array model, a complete spatial representation of the gradient coils 120 can be constructed. The element array model may include, for example, an array of conductive elements representing the wire patterns of the gradient coil 120. FIG. 4 shows one half of an example wire pattern for a transverse gradient coil. Each "*" presents a point in space where a gradient field is to be calculated.

Continuing with method 300, at 310, based on the model, a magnetic field gradient is calculated. In accordance with one implementation, the analytical equations can take the form of the following equations:

$$G_x(\vec{r}) = \frac{I\mu_0}{4\pi}\sum_i\left(\frac{-3(x-x'_i)[dx'_i(y-y'_i)-dy'_i(x-x'_i)]}{\|\vec{r}-\vec{r}'_i\|^5} - \frac{dy'_i}{\|\vec{r}-\vec{r}'_i\|^3}\right)$$

$$G_y(\vec{r}) = \frac{I\mu_0}{4\pi}\sum_i\left(\frac{-3(y-y'_i)[dx'_i(y-y'_i)-dy'_i(x-x'_i)]}{\|\vec{r}-\vec{r}'_i\|^5} + \frac{dx'_i}{\|\vec{r}-\vec{r}'_i\|^3}\right)$$

$$G_z(\vec{r}) = \frac{I\mu_0}{4\pi}\sum_i\left(\frac{-3(z-z'_i)[dx'_i(y-y'_i)-dy'_i(x-x'_i)]}{\|\vec{r}-\vec{r}'_i\|^5}\right)$$

wherein, x', y', and z' represent the locations of current elements of a wire pattern of the gradient coil, and dx', dy', and dz' represent the lengths of the elements making up the conducting pathways. I represents the current in the wire in amps (A), $\mu_0$ represents the permeability of free space and r is the radius from the wire.

The above equations may be used to calculate the magnetic field gradient at each voxel in the imaging volume. Alternatively, the magnetic field gradients corresponding to a discontinuous sample of voxels within the imaging volume may be calculated and then stored in a low-resolution, three-dimensional array in memory 156. At a later time, the stored three-dimensional arrays may be interpolated to obtain the magnetic field gradient at each voxel. As a further option, linear combinations of stored and interpolated arrays of the same gradient coil can be combined together to obtain the magnetic field gradient at each voxel for that gradient coil. Linear combinations of stored and interpolated arrays of multiple gradient coils may also be combined together to obtain the magnetic field gradient at each voxel within the imaging volume for the multiple gradient coils when used together.

Accordingly, the gradient fields within the imaging volume can be pre-calculated, calculated in real-time, or acquired from a combination of both steps for different voxels within the imaging volume. A particular feature of the present method is that it can be used to calculate gradient fields for both symmetric and asymmetric gradient coils. This may be particularly helpful during stroke imaging, or imagining of a patient's head, where real-time calculations in diffusion imaging are desired.

Once the gradient of the field is known at a particular voxel location, the non-linearity tensor may be calculated at 312 from the magnetic field gradient at the corresponding voxel. Such calculations typically use the equation:

$G(r)=L(r)G_0$

Where $L(r)$ is the non-linearity tensor, $G_0$ is the desired magnetic field gradient and $G(r)$ is the calculated magnetic field gradient.

At this point, the non-linearity tensor may then be used directly to correct motion sensitive encoding at 316, and/or the non-linearity tensor may be stored at 314 in memory 156 for retrieval at another time at 304.

After the non-linearity tensor has been obtained, whether by retrieval or calculation or a combination thereof, the motion sensitive encoding is corrected at 316 using the non-linearity tensor. All types of motion-sensitive encoding are contemplated in method 300, including diffusion imaging and velocity encoded imaging. Accordingly, correction at 316 may comprise calculating corrected a b-value using the non-linearity tensor, calculating corrected gradient moments or deriving a corrected diffusion tensor.

Motion sensitive encoding, specifically diffusion encoding, encapsulates gradient dependent encoding within the well-known expression for the b-value of the motion sensitive encoding where:

$b=\gamma^2(G_0\cdot r)^2\delta^2(\Delta-\delta/3)$ where $G_0$ is the desired amplitude of the applied gradient field, δ is the duration of the gradient pulses separated by time interval Δ, and γ is the gyromagnetic ratio.

The correction for the non-linearity tensor can be applied at location r using any known method. After applying the correction for the non-linearity tensor at location r, the corrected gradient amplitude $G_{corr}$ is obtained such that the corrected b-value can be computed using an expression similar to:

$$b=\gamma^2(G_{corr}\cdot r)^2\delta^2(\Delta-\delta/3)$$

Corrected diffusion tensors are similarly calculated. Generally, diffusion tensors are computed based on a number of MR measurements over differently applied gradient directions r and gradients G before computing the diffusion tensor. The b-value correction described above is applied before performing standard diffusion tensor calculations to obtain the corrected diffusion tensor.

The calculated or derived corrected parameters (i.e. motion sensitive encoding) are then used by correction processor 154 at 318 to generate corrected images from the signals received from the imaging volume.

If a corrected b-value is calculated or corrected diffusion tensors are derived at 316, a corrected diffusion-weighted image or diffusion tensor image sequence may be generated at 318.

Diffusion weighted imaging is a mechanism by which image contrast can be generated based on "apparent diffusivity", the random displacement of water. Diffusion weighted imaging is a widely used magnetic imaging modality that uses diffusion of water molecules in tissue to generate contrast in magnetic resonance images.

As understood in MR imaging, an applied magnetic field influences the phase of the spins of protons in water molecules. The radio frequency pulse is made dependent on motion, or is "diffusion weighted", by the addition of two diffusion gradient pulses. The first gradient pulse alters the phase shift of the each proton by an amount proportional or dependent on the water molecule's spatial location relative to the gradient. The second gradient pulse (equal and opposite in effect to the first), will reverse this phase shift if the water molecule has not moved between the application of the first and second pulses. If the water molecule has moved between the application of the first and second gradient pulses, the complete rephasing cannot happen, causing signal loss from this spatial location. The amount of signal loss is directly proportional to the extent of motion of the water molecules. Signal loss is also proportional to the preferential diffusion direction of the water molecules.

If diffusion gradients are applied in at least 6 non-collinear directions, a diffusion tensor (or a 3×3 matrix) may be acquired at each voxel that describes diffusion anisotropy.

The acquired diffusion signals can be organized and stored in a temporary matrix referred to as q-space. The application of a single pulsed gradient sequence provides one diffusion-weighted image that corresponds to one positioned in q-space. To transform the raw MR imaging data from q-space into a visual image showing the diffusion probability density function, a Fourier Transform is applied.

In this manner, a corrected diffusion-weighted image or diffusion tensor image sequence may be generated from the q-space data when it is subjected to a Fourier transform using the corrected b-value or corrected diffusion tensor. The size of the Fourier Transform is determined by the q-space array size.

Alternatively, gradient moments may be calculated at 316, for use in velocity encoding.

MR data can be velocity encoded through the application of time varying gradients, for example, bi-polar gradient waveform shapes are often used. The phase of the MR signal in this application is sensitive to the first moment of the applied gradient waveforms. Generally, the velocity encoded signal depends on:

$$\int G(t) t\, dt$$

Applying the non-linearity tensor will result in a corrected gradient value $G_{corr}$ (e.g., as described above) at each spatial location such that the velocity encoding calculation after correction should be derived based on:

$$\int G_{corr}(t) t\, dt$$

$V_{ENC}$ is an operator-specified aliasing velocity parameter specific to any one velocity encoding application, used in phase-contrast MR imaging and phase-contract MR-angiography. $V_{ENC}$ reflects the highest velocities likely to be encountered within a vessel of interest. Varying the velocity encoding parameter, $V_{ENC}$, adjusts the strength of the bipolar gradients so that the maximum velocity chosen corresponds to a 180° phase shift in the data.

In phase difference images, the voxel values will be proportional to the blood velocity within a maximum range determined by the velocity encoding parameter. Additional scans may be performed to sensitize flow in other directions or at other velocities. Using appropriate velocity encoding gradients flow or motion, dependant phase effects may be used to measure two datasets with different velocity dependant signal phases at otherwise matching acquisition parameters. Subtraction of the two resulting phase images allows the quantitative evaluation of the velocities of the underlying flow or motion.

In this way, if gradient moments are calculated at 316, a corrected velocity encoding imaging sequence may then be generated by correction processor 154 at 318 from the acquired signals from the imaging volume.

While some embodiments or aspects of the present disclosure may be implemented in fully functioning computers and computer systems, other embodiments or aspects may be capable of being distributed as a computing product in a variety of forms and may be capable of being applied regardless of the particular type of machine or computer readable media used to actually effect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as ROM, volatile RAM, non-volatile memory, cache or a remote storage device.

A computer readable storage medium may be used to store software and data which when executed by a data processing system causes the system to perform various methods or techniques of the present disclosure. The executable software and data may be stored in various places including for example ROM, volatile RAM, non-volatile memory and/or cache. Portions of this software and/or data may be stored in any one of these storage devices.

Examples of computer-readable storage media may include, but are not limited to, recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like. The storage medium may be the internet cloud, or a computer readable storage medium such as a disc.

Furthermore, at least some of the methods described herein may be capable of being distributed in a computer program product comprising a computer readable medium that bears computer usable instructions for execution by one or more processors, to perform aspects of the methods described. The medium may be provided in various forms such as, but not limited to, one or more diskettes, compact disks, tapes, chips, USB keys, external hard drives, wire-line transmissions, satellite transmissions, internet transmissions or downloads, magnetic and electronic storage media, digital and analog signals, and the like. The computer useable instructions may also be in various forms, including compiled and non-compiled code.

At least some of the elements of the systems described herein may be implemented by software, or a combination of software and hardware. Elements of the system that are implemented via software may be written in a high-level procedural language such as object oriented programming or a scripting language. Accordingly, the program code may be written in C, C++, J++, or any other suitable programming language and may comprise modules or classes, as is known to those skilled in object oriented programming. At least some of the elements of the system that are implemented via software and hardware may be written in assembly language, machine language or firmware as needed. In either case, the program code can be stored on storage media or on a computer readable medium that is readable by a general or special purpose programmable computing device having a processor, an operating system and the associated hardware and software that is necessary to implement the functionality of at least one of the embodiments described herein. The program code, when read by the computing device, configures the computing device to operate in a new, specific and predefined manner in order to perform at least one of the methods described herein.

While the teachings described herein are in conjunction with various embodiments for illustrative purposes, it is not intended that the teachings be limited to such embodiments. On the contrary, the teachings described and illustrated herein encompass various alternatives, modifications, and equivalents, without departing from the described embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

What is claimed is:

1. A method of correcting errors caused by non-linearities in a gradient field profile of a gradient coil in a magnetic resonance imaging (MRI) system, the method comprising:
   obtaining a non-linearity tensor at each voxel within an imaging space, the non-linearity tensor at each voxel determined from:
      a calculated magnetic field gradient at the voxel calculated using a computer model representing conducting pathways of the gradient coil, and
      a desired magnetic field gradient at the corresponding voxel;
   correcting motion sensitive encoding by calculating a corrected parameter using the non-linearity tensor; and
   generating a corrected image from signals from the imaging space using the motion sensitive encoding modified by the corrected parameter.

2. The method of claim 1, wherein obtaining the non-linearity tensor comprises creating the computer model of the gradient coil, the computer model comprising an element array model of connecting pathways of the gradient coil and other current carrying wires present in the gradient coil.

3. The method of claim 2, wherein the computer model used to calculate the calculated magnetic field gradient uses equations:

$$G_x(\vec{r}) = \frac{I\mu_0}{4\pi} \sum_i \left( \frac{-3(x-x'_i)[dx'_i(y-y'_i) - dy'_i(x-x'_i)]}{\|\vec{r}-\vec{r}'_i\|^5} - \frac{dy'_i}{\|\vec{r}-\vec{r}'_i\|^3} \right)$$

$$G_y(\vec{r}) = \frac{I\mu_0}{4\pi} \sum_i \left( \frac{-3(y-y'_i)[dx'_i(y-y'_i) - dy'_i(x-x'_i)]}{\|\vec{r}-\vec{r}'_i\|^5} + \frac{dx'_i}{\|\vec{r}-\vec{r}'_i\|^3} \right)$$

$$G_z(\vec{r}) = \frac{I\mu_0}{4\pi} \sum_i \left( \frac{-3(z-z'_i)[dx'_i(y-y'_i) - dy'_i(x-x'_i)]}{\|\vec{r}-\vec{r}'_i\|^5} \right)$$

wherein, x', y', and z' represent the locations of current elements of a wire pattern of the gradient coil, and dx', dy', and dz' represent the lengths of the elements making up the conducting pathways.

4. The method of claim 3, wherein obtaining the non-linearity tensor at each voxel comprises calculating the magnetic field gradient and the non-linearity tensor at each voxel in real-time during image acquisition.

5. The method of 3, further comprising storing the calculated magnetic field gradient in a low-resolution, three-dimensional array, wherein the low-resolution, three-dimensional array comprises calculated magnetic field gradients corresponding to a discontinuous sample of voxels within the imaging space.

6. The method of claim 5, wherein obtaining the non-linearity tensor at each voxel comprises interpolating the stored three-dimensional array to obtain the calculated magnetic field gradient at each voxel.

7. The method of claim 1, wherein the MRI system comprises multiple gradient coils and obtaining the non-linearity tensor comprises creating the computer model of the multiple gradient coils, the computer model comprising an element array model of a set of elements joined together to form a spatial representation of the conducting pathways for the multiple gradient coils.

8. The method of claim 1, wherein obtaining the non-linearity tensor comprises retrieving the non-linearity tensor that was stored in memory of the MRI system.

9. The method of claim 1, wherein determining the corrected parameter comprises calculating a corrected b-value using the non-linearity tensor.

10. The method of claim 9, wherein the corrected image generated is a corrected diffusion-weighted image.

11. The method of claim 1, wherein determining the corrected parameter comprises deriving a corrected diffusion tensor using the non-linearity tensor.

12. The method of claim 11, wherein the corrected image generated is a corrected diffusion tensor image sequence.

13. The method of claim 1, wherein determining the corrected parameter comprises calculating corrected gradient moments.

14. The method of claim 13, wherein the corrected image generated is a corrected velocity encoding imaging sequence.

15. The method of claim 1, wherein the gradient coil is an asymmetric gradient coil.

16. A system for correcting errors caused by non-linearities in a gradient field profile of a gradient coil in a magnetic resonance imaging (MRI) system, the system comprising:
a receiver for receiving a signal from an imaging space;
a processor coupled to the receiver and configured to:
obtain a non-linearity tensor at each voxel within the imaging space, the non-linearity tensor at each voxel determined from:
a calculated magnetic field gradient at the voxel calculated using a computer model representing conducting pathways of the gradient coil of the system, and
a desired magnetic field gradient at the corresponding voxel;
correct motion sensitive encoding by calculating a corrected parameter using the non-linearity tensor; and
generate a corrected image from the signal using the motion sensitive encoding modified by the corrected parameter.

17. The system of claim 16, further comprising a memory for storing the calculated magnetic field gradient and the non-linearity tensor at each voxel for retrieval by the processor.

18. The system of claim 16, wherein the gradient coil is an asymmetric gradient coil.

19. The system of claim 16, wherein the processor is further configured to create the computer model of the gradient coil, the computer model comprising an element array model of connecting pathways of the gradient coil and other current carrying wires present in the gradient coil.

20. The system of claim 19, wherein the computer model used to calculate the calculated magnetic field gradient uses equations:

$$G_x(\vec{r}) = \frac{I\mu_0}{4\pi} \sum_i \left( \frac{-3(x - x'_i)[dx'_i(y - y'_i) - dy'_i(x - x'_i)]}{\|\vec{r} - \vec{r}'_i\|^5} - \frac{dy'_i}{\|\vec{r} - \vec{r}'_i\|^3} \right)$$

$$G_y(\vec{r}) = \frac{I\mu_0}{4\pi} \sum_i \left( \frac{-3(y - y'_i)[dx'_i(y - y'_i) - dy'_i(x - x'_i)]}{\|\vec{r} - \vec{r}'_i\|^5} + \frac{dx'_i}{\|\vec{r} - \vec{r}'_i\|^3} \right)$$

$$G_z(\vec{r}) = \frac{I\mu_0}{4\pi} \sum_i \left( \frac{-3(z - z'_i)[dx'_i(y - y'_i) - dy'_i(x - x'_i)]}{\|\vec{r} - \vec{r}'_i\|^5} \right)$$

wherein, x', y', and z' represent the locations of current elements of a wire pattern of the gradient coil, and dx', dy', and dz' represent the lengths of the elements making up the conducting pathways.

* * * * *